(12) United States Patent
Park et al.

(10) Patent No.: US 11,483,932 B2
(45) Date of Patent: Oct. 25, 2022

(54) DISPLAY DEVICE INCLUDING OVERLAPPING CONNECTION CIRCUIT BOARDS

(71) Applicant: SAMSUNG DISPLAY CO., LTD., Yongin-si (KR)

(72) Inventors: Bongchun Park, Incheon (KR); Sangmi Kim, Yongin-si (KR); Yeon-Sung Kim, Suwon-si (KR); Po-Yun Park, Seoul (KR); Seungjae Kang, Asan-si (KR); Il Hyun Yang, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 223 days.

(21) Appl. No.: 16/727,527

(22) Filed: Dec. 26, 2019

(65) Prior Publication Data

US 2020/0267842 A1    Aug. 20, 2020

(30) Foreign Application Priority Data

Feb. 19, 2019    (KR) .................. 10-2019-0019006

(51) Int. Cl.
*H05K 1/18* (2006.01)
*H01L 27/32* (2006.01)
(Continued)

(52) U.S. Cl.
CPC ......... *H05K 1/189* (2013.01); *H01L 27/3276* (2013.01); *H05K 1/118* (2013.01);
(Continued)

(58) Field of Classification Search
CPC ........ H05K 1/189; H05K 1/118; H05K 1/147; H05K 1/14; H05K 1/111; H05K 1/02;
(Continued)

(56) References Cited

U.S. PATENT DOCUMENTS 8,305,541 B2    11/2012    Hwang
9,318,398 B2    4/2016    Lee
(Continued)

FOREIGN PATENT DOCUMENTS

KR    10-2005-0019562    3/2005
KR    10-2014-0128733    11/2014
(Continued)

*Primary Examiner* — Roshn K Varghese
(74) *Attorney, Agent, or Firm* — F. Chau & Associates, LLC

(57) ABSTRACT

A display device includes a display panel including first pads in a first row and second pads in a second row, a driving circuit board, a first connection circuit board including a first output portion on which first output pads bonded to the first pads of the display panel are disposed, a first input portion on which first input pads bonded to the driving circuit board are disposed, and a first protruding portion, and a second connection circuit board including a second output portion which overlap at least a portion of the first output portion and on which second output pads bonded to the second pads of the display panel are disposed, and a second input portion on which second input pads bonded to the driving circuit board are disposed. At least a portion of the first protruding portion is disposed on the second input portion.

20 Claims, 15 Drawing Sheets

(51) Int. Cl.
*H05K 1/11* (2006.01)
*H01R 12/62* (2011.01)

(52) U.S. Cl.
CPC ........ *H01R 12/62* (2013.01); *H05K 2201/041* (2013.01); *H05K 2201/049* (2013.01); *H05K 2201/10128* (2013.01)

(58) Field of Classification Search
CPC .................. H05K 1/117; H05K 1/144; H05K 2201/10128; H05K 2201/041; H05K 2201/049; H05K 2201/09409; H05K 2201/091; H05K 2201/09081; H05K 2201/09045; H05K 2201/09009; H05K 3/323; H01L 27/3276; H01L 27/32; H01R 12/62; G09G 3/3208; G02F 1/13452; G06F 3/04164
See application file for complete search history.

(56) References Cited

U.S. PATENT DOCUMENTS

| | | | |
|---|---|---|---|
| 9,775,248 B2 | 9/2017 | Kim | |
| 2016/0198560 A1* | 7/2016 | Shin | ........................ H05K 1/028 362/600 |
| 2017/0135213 A1* | 5/2017 | Lee | ........................ H05K 1/111 |
| 2018/0068992 A1* | 3/2018 | Oh | ........................... H01L 25/18 |
| 2018/0375235 A1* | 12/2018 | Nakano | .................. H05K 1/147 |

FOREIGN PATENT DOCUMENTS

| | | |
|---|---|---|
| KR | 10-2016-0101823 | 8/2016 |
| KR | 10-1644980 | 8/2016 |

\* cited by examiner

DISPLAY DEVICE INCLUDING OVERLAPPING CONNECTION CIRCUIT BOARDS

CROSS-REFERENCE TO RELATED APPLICATION

This U.S. non-provisional patent application claims priority under 35 U.S.C. § 119 to Korean Patent Application No. 10-2019-0019006, filed on Feb. 19, 2019, the disclosure of which is incorporated by reference herein in its entirety.

BACKGROUND

1. Technical Field

The present disclosure relates to a display device, and more particularly, to a display device including overlapping connection circuit boards.

2. Discussion of Related Art

A display panel may be manufactured and connected to a circuit board. For example, a tape automated bonding (TAB) mounting method of connecting the display panel and the circuit board may be used. The circuit board may also be bonded to the display panel by using an anisotropic conductive film (ACF).

The circuit board may include a driving circuit board for generating driving signals required to drive the display panel, and a connection circuit board for transmitting the driving signals to the display panel. One end of the connection circuit board may be bonded to the display panel, and another end of the connection circuit board may be bonded to the driving circuit board.

As sizes of display panels increase, a plurality of the connection circuit boards may be used to connect the display panel and the driving circuit board. However, a degree of misalignment may occur in the process of bonding the connection circuit boards to the driving circuit board.

SUMMARY

Exemplary embodiments of the present invention provide for a display device capable of easily bonding connection circuit boards and a driving circuit board.

According to an exemplary embodiment of the present invention, a display device includes a display panel including first pads in a first row and second pads in a second row, a driving circuit board, and a first and second connection circuit board. The first connection circuit board includes a first output portion on which first output pads bonded to the first pads of the display panel are disposed, a first input portion on which first input pads bonded to the driving circuit board are disposed, and a first protruding portion. The second connection circuit board includes a second output portion which overlap at least a portion of the first output portion and on which second output pads bonded to the second pads of the display panel are disposed, and a second input portion on which second input pads bonded to the driving circuit board are disposed. At least a portion of the first protruding portion is disposed on the second input portion.

According to an exemplary embodiment of the present invention, a display device is provided. The display device includes a display panel including a plurality of first pads arranged in a first row and a plurality of second pads arranged in a second row. A driving circuit board is configured to provide driving signals to the display panel. A first connection circuit board includes a first output portion on which first output pads bonded to the first pads are disposed, a first input portion on which first input pads bonded to the driving circuit board are disposed, and a substantially flat first protruding portion protruding front the first input portion. A second connection circuit board includes a second output portion which overlaps at least a portion of the first output portion and on which second output pads bonded to the second pads are disposed, a second input portion on which second input pads bonded to the driving circuit board are disposed, and a substantially flat second protruding portion connected to the second input portion and disposed on the first protruding portion. An adhesive is disposed between the first protruding portion and the second protruding portion.

According to an exemplary embodiment of the present invention, a display device is provided including a display panel, a driving circuit board, and a first connection circuit board including an upper and a lower surface disposed between the display panel and the driving printed circuit board. The lower surface of the first connection board is electrically connected to both the display panel and the driving circuit board. A second connection circuit board is disposed on the upper surface of the first connection circuit board. A portion of the first connection circuit board is disposed on an upper surface of the second connection circuit board.

BRIEF DESCRIPTION OF THE DRAWINGS

The above and other features of the present invention will become more apparent with reference to the following Detailed Description when considered in conjunction with the attached drawings, in which.

DETAILED DESCRIPTION OF THE EMBODIMENTS

Figure 1A:
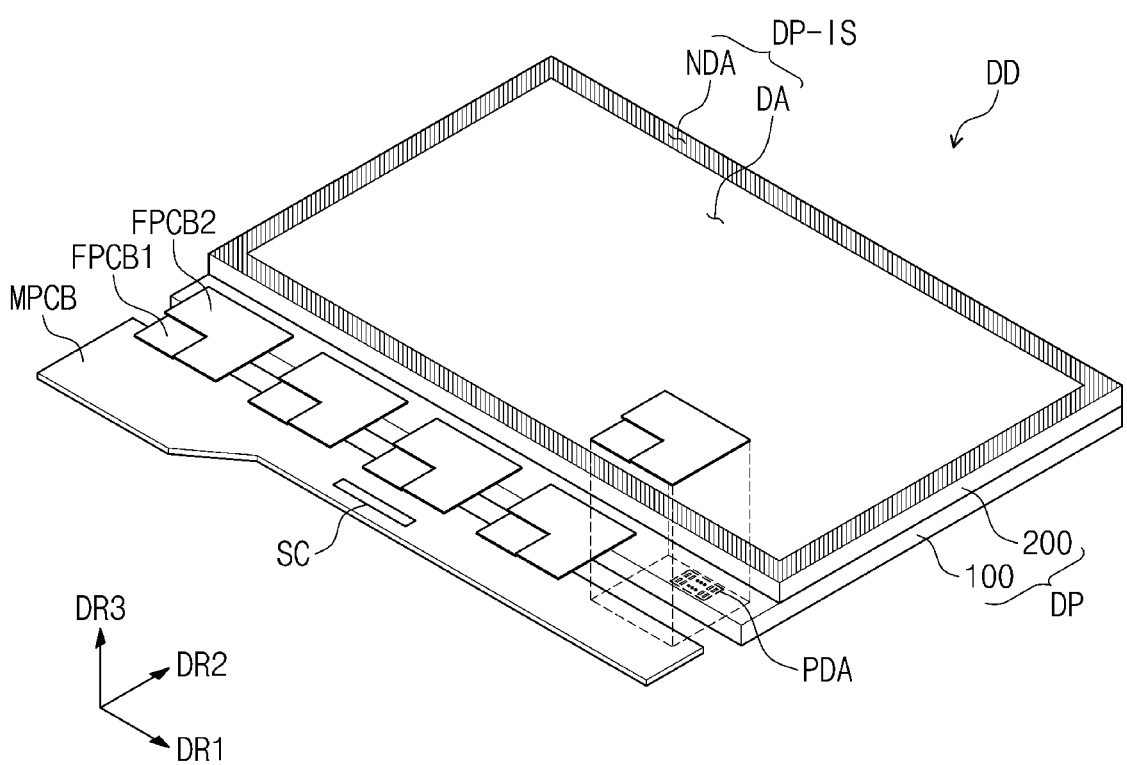
FIG. 1A is a perspective view illustrating a display device according to an exemplary embodiment of the present invention.

Exemplary embodiments of the present invention will now be described more fully hereinafter with reference to the accompanying drawings. The present invention may be modified in various ways and should not be construed as limited to the exemplary embodiments set forth herein. Like reference numerals may refer to like elements throughout the specification and the drawings.

It will be understood that when an element such as a layer, region or substrate is referred to as being "on" another element, it can be directly on the other element or intervening elements may be present. Exemplary embodiments of the present invention are described herein with reference to cross-sectional illustrations and/or plane illustrations that may be idealized exemplary illustrations. In the drawings, the thicknesses of layers and regions may be exaggerated for clarity. Accordingly, variations from the shapes of the illustrations as a result, for example, of manufacturing techniques and/or tolerances, are to be expected. For example, an etching region illustrated as a rectangle may have rounded or curved features. Thus, the regions illustrated in the figures may be schematic in nature and their shapes are not necessarily limited to the precise shapes shown.

Hereafter, exemplary embodiments of the present invention will be described in detail with reference to the accompanying drawings.

Figure 1B:
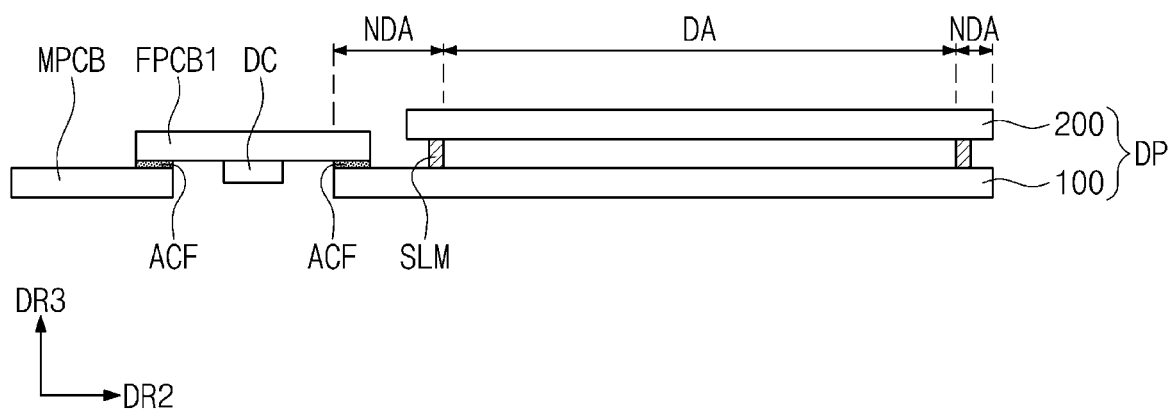
FIG. 1B is a cross-sectional view illustrating a display device according to an exemplary embodiment of the present invention.
Figure 2:
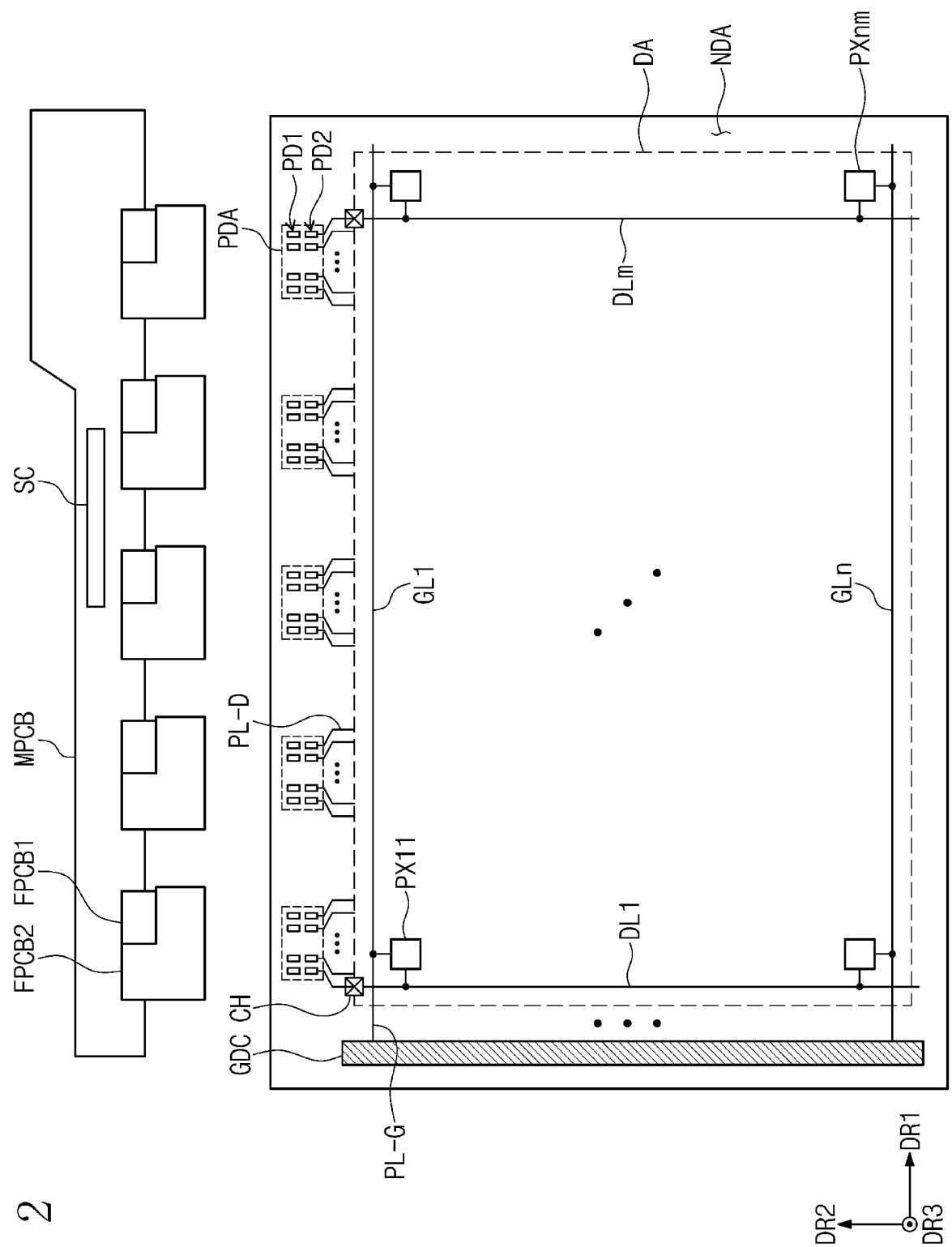
FIG. 2 is a plan view illustrating a display device according to an exemplary embodiment of the present invention.

FIG. 1A is a perspective view illustrating a display device according to an exemplary embodiment of the present invention. FIG. 1B is a cross-sectional view illustrating a display device according to an exemplary embodiment of the present invention. FIG. 2 is a plan view illustrating a display device according to an exemplary embodiment of the present invention.

Referring to FIGS. 1A to 2, a display device DD includes a display panel DP, connection circuit boards FPCB1 and FPCB2, and a driving circuit board MPCB. In the present exemplary embodiment, driving chips DC are mounted on the connection circuit boards FPCB1 and FPCB2. However, the present invention is not limited thereto. According to an exemplary embodiment of the present invention, the driving chip DC might not be mounted on the connection circuit boards FPCB1 and FPCB2 but may instead be mounted, for example, on the display panel DP or the driving circuit board MPCB.

The display device DD may further include a chassis member or a molding member and may further include a backlight unit in accordance with a type of the display panel DP.

The display panel DP may be, but is not limited to being a liquid crystal display panel, a plasma display panel, an electrophoretic display panel, a microelectromechanical system (MEMS) display panel, an electrowetting display panel, or an organic light emitting display panel.

The display panel DP includes a first display substrate 100 and a second display substrate 200 facing and spaced apart from the first display substrate 100. A cell gap is formed between the first display substrate 100 and the second display substrate 200. The cell gap is maintained by a sealant SLM coupling the first display substrate 100 and the second display substrate 200. A gray scale display layer for generating an image may be disposed between the first display substrate 100 and the second display substrate 200. The gray scale display layer may include a liquid crystal layer, an organic light emitting layer, or an electrophoretic layer, in accordance with a type of the display panel DP.

As illustrated in FIG. 1A, the display panel DP displays an image through a display surface DP-IS. The display surface DP-IS is on a plane defined by a first direction (e.g., a DR1 direction) and a second direction (e.g., a DR2 direction). The display surface DP-IS includes a display area DA and a non-display area NDA. The non-display area NDA is defined along a border of the display surface DP-IS. The display area DA is at least partially surrounded by the non-display area NDA when viewed in a plan view. For example, the non-display area NDA may be defined in only one side area of the display surface DP-IS, which is a side area adjacent to the connection circuit boards FPCB1 and FPCB2.

A normal direction of the display surface DP-IS (i.e., a thickness direction of the display panel DP) is indicated by a third direction (e.g., a DR3 direction). Hereinafter, a front surface (also referred to herein as a top surface) and a rear surface (also referred to herein as a bottom surface) of each layer or unit may refer to surfaces separated in the third direction (e.g. the DR3 direction).

The display panel DP having a planar display surface DP-IS is illustrated in the present exemplary embodiment. However, the present invention is not limited thereto. For example, the display device DD may include a curved display surface or a three-dimensional (3D) display surface. The 3D display surface may include a plurality of display areas indicated by different directions.

A signal controller SC is mounted on the driving circuit board MPCB. The signal controller SC receives image data and control signals from an external graphic controller. The signal controller SC provides the control signals to the display panel DP.

The connection circuit boards FPCB1 and FPCB2 are electrically connected to the display panel DP and the driving circuit board MPCB. The connection circuit boards FPCB1 and FPCB1 transmit signals from the driving circuit board MPCB to the driving chips DC and transmit signals from the driving chips DC to the display panel DP. According to an exemplary embodiment of the present invention, the driving chip DC may be a data driving circuit. According to an exemplary embodiment of the present invention, the connection circuit boards FPCB1 and FPCB2 may transmit signals from the signal controller SC to the display panel DP.

The connection circuit boards FPCB1 and FPCB2 are connected to the display panel DP and the driving circuit board MPCB through conductive adhesive members. The conductive adhesive member may include an anisotropic conductive film ACF. Hereinafter, the anisotropic conductive film ACF will be described as an example of the conductive adhesive member.

According to an exemplary embodiment of the present invention, the connection circuit boards FPCB1 and FPCB2 may include two different kinds of circuit boards. The two connection circuit boards FPCB1 and FPCB2 are connected to pads arranged in different rows in a pad area PDA. The pad area PDA is defined on the first display substrate 100. However, the present invention is not limited thereto. According to an exemplary embodiment of the present invention, the pad area PDA may be defined in the second display substrate 200.

FIG. 2 illustrates a planar arrangement of signal lines GL1 to GLn, DL1 to DLm, PL-G and PL-D and pixels PX11 to PXnm. The signal lines GL1 to GLn, DL1 to DLm, PL-G and PL-D include a plurality of gate lines GL to GLn, a plurality of data lines DL1 to DLm, and auxiliary signal lines PL-G and PL-D.

The gate lines GL1 to GLn extend in the first direction (e.g., the DR1 direction) and are arranged in the second direction (e.g., the DR2 direction), and die data lines DL1 to DLm may be insulated from the gate lines GL to GLn and intersect the gate lines GL1 to GLn. For example, the data lines DL1 to DLm are arranged apart from one another in the first direction (e.g., the DR1 direction) and extend in the second direction (e.g., the DR2 direction) orthogonally intersecting gate lines GL1 to GLn. The gate lines GL1 to GLn and the data lines DL1 to DLm at least partially overlap the display area DA. The auxiliary signal lines PL-G and PL-D at least partially overlap the non-display area NDA and are connected to the gate lines GL1 to GLn and the data lines DL1 to DLm.

First auxiliary signal lines PL-G connected to the gate lines GL1 to GLn may be disposed on the same layer as the gate lines GL1 to GLn. A first auxiliary signal line PL-G and a gate line connected thereto may be referred to herein as a single unitary body. However, the present invention is not limited thereto. For example, the gate lines GL1 to GLn and the first auxiliary signal lines PL-G may refer to discrete elements. However, according to an exemplary embodiment of the present invention, the gate line and the first auxiliary signal line connected to each other may be defined as one signal line. In this case, the gate line and the first auxiliary signal line connected thereto may be defined as different portions of the same one signal line.

Second auxiliary signal lines PL-D are connected to the data lines DL1 to DLm and may be disposed on a layer different from a layer on which the data lines DL1 to DLm are disposed. Each of the data lines DL1 to DLm are electrically connected to a corresponding one of the second auxiliary signal lines PL-D through a contact hole CH. The contact hole CH penetrates at least one insulating layer disposed between the data lines DL1 to DLm and the second auxiliary signal lines PL-D. In FIG. 2, two contact holes CH are illustrated as an example.

According to an exemplary embodiment of the present invention, the contact hole CH may be omitted. In this case, the data lines DL1 to DLm and the second auxiliary signal lines PL-D may be disposed on the same layer. In this case, the data line and the second auxiliary signal line connected thereto may be defined as one signal line. For example, the data line and the second auxiliary signal line connected to each other may be defined as different portions of the same one signal line.

Each of the pixels PX11 to PXnm is connected to a corresponding one of the plurality of gate lines GL1 to GLn and a corresponding one of the plurality of data lines DL1 to DLm. Each of the pixels PX11 to PXnm include a pixel driving circuit and a display element.

As illustrated in FIG. 2, pads PD1 and PD2 are arranged in different rows in each of the pad areas PDA. First pads PD1 are disposed in a first row and arranged in the first direction (e.g., the DR1 direction). Second pads PD2 are disposed in a second row and arranged in the first direction (e.g, the DR1 direction) and may be spaced apart from the first pads PD1 in the second direction (e.g., the DR2 direction) intersecting the first direction (e.g., the DR1 direction). The second pads PD2 in the second row are closer to the display area DA in the second direction (e.g., the DR2 direction) than the first pads PD1 in the first row. The first pads PD1 and the second pads PD2 are connected to the second auxiliary signal lines PL-D.

A gate driving circuit GDC may be integrated in the display panel DP by an oxide silicon gate driving circuit (OSG) process and/or an amorphous silicon gate driving circuit (ASG) process. The first auxiliary signal lines PL-G may receive gate signals from the gate driving circuit GDC.

Figure 3:
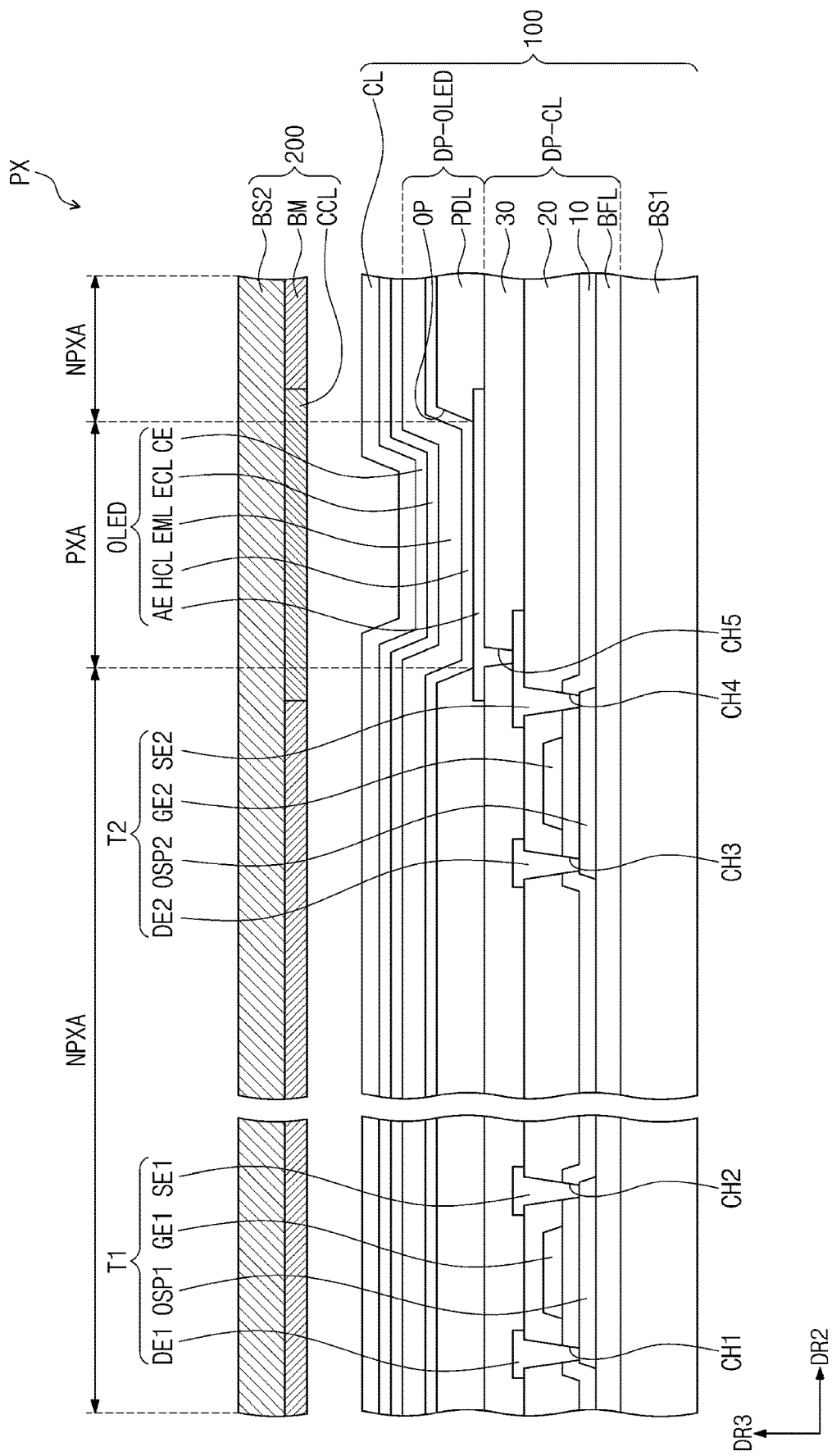
FIG. 3 is a cross-sectional view illustrating a display area of a display panel according to an exemplary embodiment of the present invention.

FIG. 3 is a cross-sectional view illustrating a display area of a display panel according to an exemplary embodiment of the present invention. FIG. 3 illustrates a cross section of a pixel PX of an organic light emitting display panel as an example. The pixel PX of the organic light emitting display panel includes a switching transistor T1, a driving transistor T2, and a light emitting element OLED.

The first display substrate 100 includes a first base substrate BS1, a circuit element layer DP-CL disposed on the first base substrate BS1, a display element layer DP-OLED disposed on the circuit element layer DP-CL, and a cover layer CL disposed on the display element layer DP-OLED. The second display substrate 200 includes a second base substrate BS2, black matrix layer BM and a light control layer CCL which are disposed on the second base substrate BS2. For example, the light control layer CCL of the second display substrate 200 overlaps the light emitting area PXA of the pixel PX in a thickness direction (e.g., the DR3 direction), and the black matrix layer BM adjacent and substantially co-planar therewith at least partially overlaps the non-light emitting area NPXA in a thickness direction (e.g., the DR3 direction).

The first base substrate BS1 may include a synthetic resin substrate and/or a glass substrate. The circuit element layer DP-CL may include at least one insulating layer and a circuit element. The circuit element may include signal lines and the pixel driving circuit of the pixel. The circuit element layer DP-CL may be formed through processes of forming the insulating layer, a semiconductor layer and a conductive layer using coating and/or deposition processes and processes of patterning the insulating layer, the semiconductor layer and the conductive layer using photolithography processes.

The circuit element layer DP-CL includes a buffer layer BFL, a first insulating layer 10, a second insulating layer 20, and a third insulating layer 30. The first insulating layer 10 and the second insulating layer 20 may be inorganic layers, and the third insulating layer 30 may be an organic layer. The first insulating layer 10, the second insulating layer 20, and the third insulating layer 30 are sequentially stacked on the buffer layer BFL or the base substrate BS1 if the buffer layer BFL is omitted.

FIG. 3 illustrates relative positions of a first semiconductor pattern OSP1, a second semiconductor pattern OSP2, a first control electrode GE1, a second control electrode GE2, a first input electrode DE1, a first output electrode SE1, a second input electrode DE2 and a second output electrode SE2, which constitute the switching transistor T1 and the driving transistor T2, respectively. First, second, third and fourth through-holes CH1, CH2, CH3 and CH4 are illustrated as an example.

The display element layer DP-OLED may include the light emitting element OLED. The display element layer DP-OLED may include an organic light emitting diode as the light emitting element. The display element layer DP-OLED may include a pixel defining layer PDL. For example, the pixel defining layer PDL may be an organic layer.

A first electrode AE is disposed on the third insulating layer 30. The first electrode AE is connected to the second output electrode SE2 through a fifth through-hole CH5 penetrating the third insulating layer 30. An opening OP is defined in the pixel defining layer PDL. The opening OP of the pixel defining layer PDL exposes at least a portion of the first electrode AE. The opening OP of the pixel defining layer PDL may also be referred to herein as an emission opening to distinguish it from other openings.

As illustrated in FIG. 3, the display panel DP includes a light emitting area PXA and a non-light emitting area NPXA adjacent to the light emitting area PXA. The non-light emitting area NPXA surrounds the light emitting area PXA. The light emitting area PXA is defined to correspond to a portion of the first electrode AE, which is exposed through the emission opening OP.

A hole control layer HCL is disposed in both the light emitting area PXA and the non-light emitting area NPXA. The hole control layer HCL may include a hole transfer layer and may further include a hole injection layer. An emission layer EML is disposed on the hole control layer HCL. The emission layer EML is disposed in both the light emitting area PXA and the non-light emitting area NPXA. Alternatively, the emission layer EML, may be disposed in the light emitting area PXA but may not be disposed in the non-light emitting area NPXA. The emission layer EML may include an organic material and/or an inorganic material. The emission layer EML may generate first color light, e.g., blue light.

An electron control layer ECL is disposed on the emission layer EML. The electron control layer ECL includes an electron transfer layer and an electron injection layer. The hole control layer HCL and the electron control layer ECL may be formed in the plurality of pixels by using an open mask. A second electrode CE is disposed on the electron control layer ECL. The second electrode CE is disposed in the plurality of pixels. The cover layer CL is disposed on the second electrode CE to protect the second electrode CE. The cover layer CL may include an organic material and/or an inorganic material.

The second base substrate BS2 is spaced apart from the cover layer CL. The second base substrate BS2 may include a synthetic resin substrate and/or a glass substrate. Depending on a kind of the pixel PX, the light control layer CCL may transmit the first color light or may convert the first color light into second color light or third color light. The light control layer CCL may include quantum dots.

According to an exemplary embodiment of the present invention, the second base substrate BS2 may be replaced with a thin film encapsulation layer. In this case, the black matrix layer BM and the light control layer CCL may be disposed on the thin film encapsulation layer.

Figure 4:
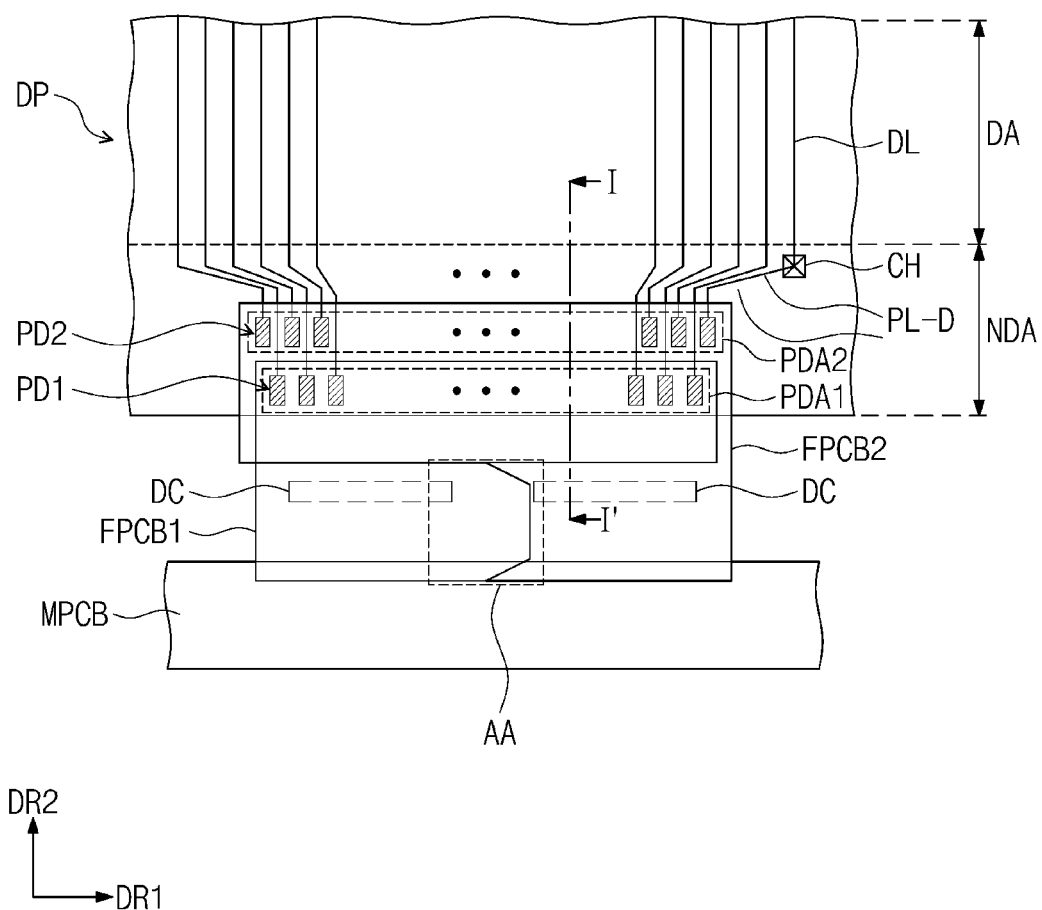
FIG. 4 is an enlarged plan view illustrating a display device according to an exemplary embodiment of the present invention.
Figure 5A:
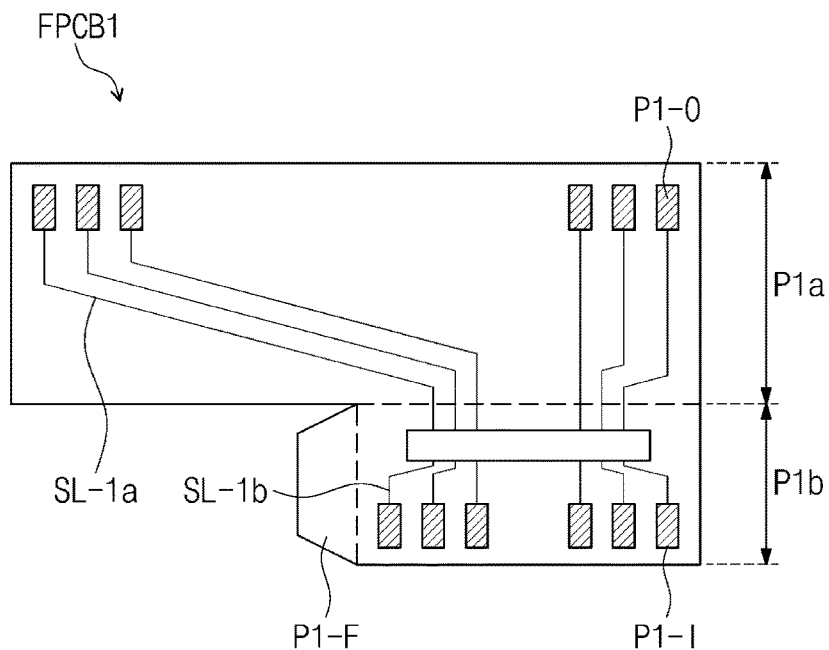
FIG. 5A is a plan view illustrating a bottom surface of a first connection circuit board according to an exemplary embodiment of the present invention.
Figure 5B:
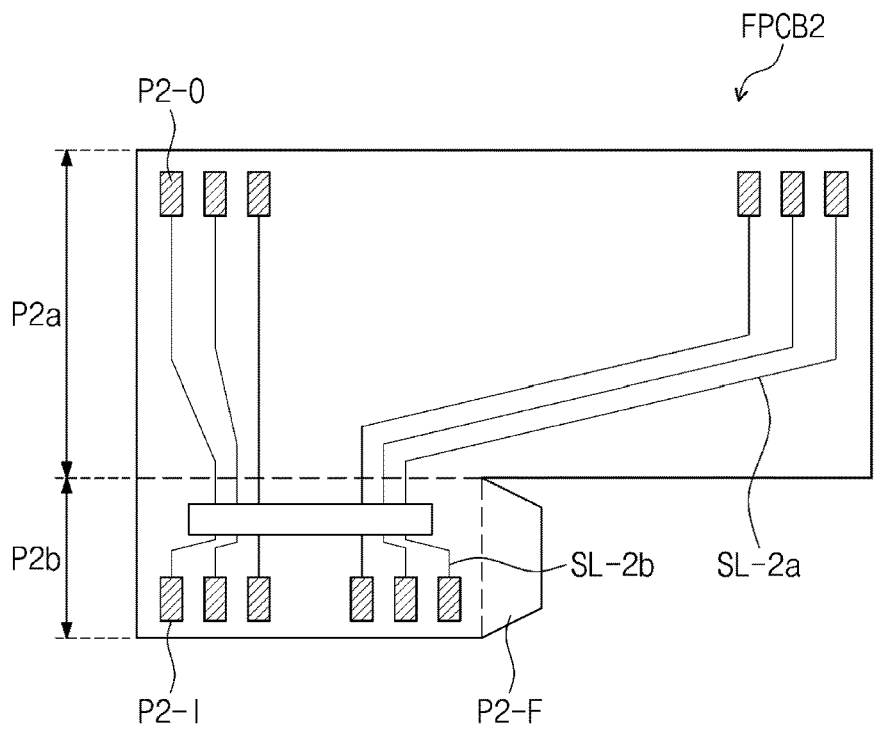
FIG. 5B is a plan view illustrating a bottom surface of a second connection circuit board according to an exemplary embodiment of the present invention.
Figure 6:
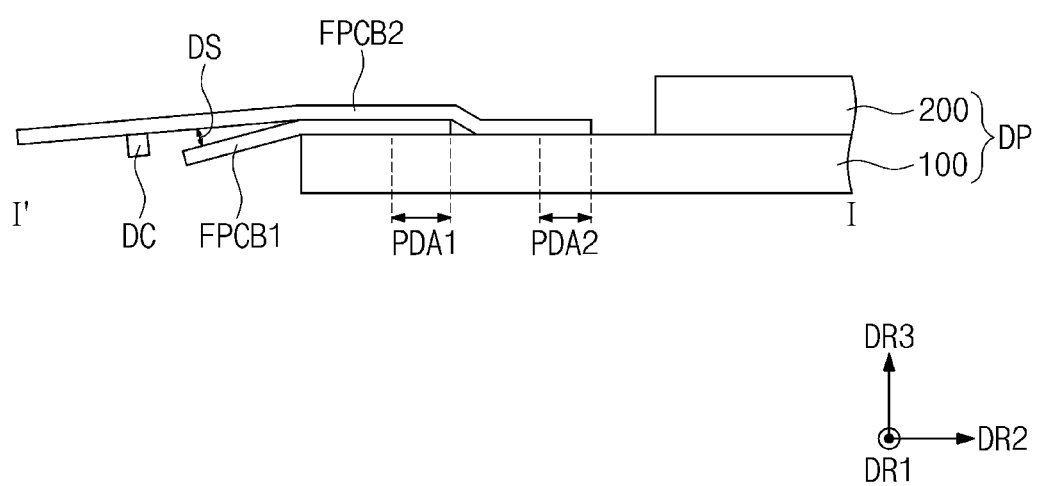
FIG. 6 is a cross-sectional view taken along a line I-I' of FIG. 4 according to an exemplary embodiment of the present invention.

FIG. 4 is an enlarged plan view illustrating a display device according to an exemplary embodiment of the present invention. FIG. 5A is a plan view illustrating a bottom surface of a first connection circuit board according to an exemplary embodiment of the present invention. FIG. 5B is a plan view illustrating a bottom surface of a second connection circuit board according to an exemplary embodiment of the present invention. FIG. 6 is a cross-sectional view taken along a line I-I' of FIG. 4.

Referring to FIG. 4, the pad area PDA disposed in the non-display area NDA of the display panel DP includes a first pad area PDA1 in which the first pads PD1 are arranged, and a second pad area PDA2 in which the second pads PD2 are arranged.

One end of a first connection circuit board FPCB1 is electrically connected to the first pads PD1, and another end of the first connection circuit board FPCB1 is electrically connected to the driving circuit board MPCB. One end of a second connection circuit board FPCB2 is electrically connected to the second pads PD2, and another end of the second connection circuit board FPCB2 is electrically connected to the driving circuit board MPCB.

Referring to FIGS. 5A and 5B, bottom surfaces of the first and second connection circuit boards FPCB1 and FPCB2 are shown. The bottom surface of each of the first and second connection circuit boards FPCB1 and FPCB2 is a surface on which pads and the driving chip are exposed. A top surface of each of die first and second connection circuit boards FPCB1 and FPCB2 is opposite to the bottom surface.

The first connection circuit board FPCB1 includes a first output portion P1*a* on which first output pads P1-0 are disposed, a first input portion P1*b* on which first input pads P1-I are disposed, and a first protruding portion P1-I protruding from the first input portion P1*b*. The first output pads P1-0, the first input pads P1-I and first signal lines SL-1*a* and SL-1*b* may be disposed on the bottom surface of the first connection circuit board FPCB1. In FIG. 5A, the driving chip DC is disposed on the first input portion P1*b*. However, according to an exemplary embodiment of the present invention, the driving chip DC may be disposed on the first output portion P1*a*.

In an exemplary embodiment of the present invention, the first output portion P1*a*, the first input portion P1*b* and the first protruding portion P1-F may constitute a single unitary body. However, the present invention is not limited thereto. According to an exemplary embodiment of the present invention, the first protruding portion P1-F may have a structure detachable from the first input portion P1*b*. However, the present invention is not limited thereto. For example, the protruding portion P1-F may be integrally formed with the first input portion P1*b*. The first protruding portion P1-F may have, for example, a trapezoidal shape.

The first output pads P1-0 are electrically connected to corresponding first pads PD1 of the first row disposed in the display panel DP and are also electrically connected to the driving chip DC. For example, the driving chip DC disposed in the first input portion P1b may be interposed between and electrically connect the first input pads P1-I and the first output pads P1-0. The first input pads P1-I may be electrically connected to corresponding driving pads disposed in the driving circuit board MPCB at one end and may be electrically connected to the driving chip DC at a second end. The first signal lines SL-1a and SL-1b may include signal lines SL-1a electrically connecting the first output pads P1-0 to the driving chip DC, and signal lines SL-1b electrically connecting the first input pads P1-I to the driving chip DC.

According to an exemplary embodiment of the present invention, a planar area of the first output portion P1a may be greater than a planar area of the first input portion P1b, and the planar area of the first input portion P1b may be greater than a planar area of the first protruding portion P1-F, when viewed in a plan view.

The second connection circuit board FPCB2 may include a second output portion P2a on which second output pads P2-0 are disposed, a second input portion P2b on which second input pads P2-I are disposed, and a second protruding portion P2-F protruding from the second input portion P2b. The second output pads P2-0, the second input pads P2-I and second signal lines SL-2a and SL-2b may be disposed on the bottom surface of the second connection circuit board FPCB2. In FIG. 5B, the driving chip DC is disposed on the second input portion P2b. However, in according to an exemplary embodiment of the present invention, the driving chip DC is disposed on the second output portion P2a.

According to an exemplary embodiment of the present invention, the second output portion P2a, the second input portion P2b and the second protruding portion P2-F may constitute a single unitary body. However, exemplary embodiments of the present invention are not limited thereto. For example, the second protruding portion P2-F may have a structure detachable from the second input portion P2b.

The second output pads P2-0 are electrically connected to the second pads PD2 of the second row disposed in the display panel DP, respectively, and are also electrically connected to the driving chip DC. The second input pads P2-I are electrically connected to driving pads disposed in the driving circuit board MPCB, respectively, and are electrically connected to the driving chip DC. The second signal lines SL-2a and SL-2b may include signal lines SL-2a electrically connecting the second output pads P2-0 to the driving chip DC, and signal lines SL-2b electrically connecting the second input pads P2-I to the driving chip DC.

According to an exemplary embodiment of the present invention, a planar area of the second output portion P2a is greater than a planar area of the second input portion P2b, and the planar area of the second input portion P2b is greater than a planar area of the second protruding portion P2-F.

Each of the first and second connection circuit boards FPCB1 and FPCB2 may include an insulating layer and the pads and the signal lines may be disposed on the insulating layer.

Referring again to FIG. 4, according to an exemplary embodiment of the present invention, the second output embodiment of the second connection circuit board FPCB2 overlaps at least a portion of the first output portion P1a of the first connection circuit board FPCB1 and is disposed on the display panel DP. For example, the second output portion P2a may overlap half or more of an area of the first output portion P1a.

This may be because the second pads PD2 bonded to the second output portion P2a are closer to the display area DA than the first pads PD1 bonded to the first output portion P1a. The first output pads P1-0 of the first connection circuit board FPCB1 may be bonded to the first pads PD1 of the display panel DP, and then, the second output pads P2-0 of the second connection circuit board FPCB2 may be bonded to the second pads PD2 of the display panel DP.

Thus, the second output portion P2a of the second connection circuit board FPCB2 overlaps the first output portion P1a of the first connection circuit board FPCB1 and is disposed on the display panel DP. However, embodiments of the present invention are not limited thereto. For example, the first and second connection circuit boards FPCB1 and FPCB2 may be bonded to the display panel DP at the same time.

In an exemplary embodiment of the present invention, the area of the second output portion P2a of FIG. 5B may be greater than the area of the first output portion P1a of FIG. 5A, when viewed in a plan view.

After the process of bonding the connection circuit boards FPCB1 and FPCB2 to the display panel DP, a process of bonding the connection circuit boards FPCB1 and FPCB2 to the driving circuit board MPCB may be performed. For example, a process of bonding the first input portion P1b to the driving circuit board MPCB and a process of bonding the second input portion P2b to the driving circuit board MPCB may be performed. However, the connection circuit boards FPCB1 and FPCB2 may be connected to the driving circuit board MPCB prior to the display panel DP.

FIG. 6 illustrates a state after the process of bonding the connection circuit boards FPCB1 and FPCB2 to the display panel DP is completed. In other words, FIG. 6 illustrates a state in which the one end of each of the connection circuit boards FPCB1 and FPCB2 is bonded to the display panel DP but the other end of each of the connection circuit boards FPCB1 and FPCB2 is not yet bonded to the driving circuit board MPCB.

For example, the one end of the first connection circuit board FPCB1 is bonded to the first pad area PDA1, and the one end of the second connection circuit board FPCB2 is bonded to the second pad area PDA2. Here, the one end of each of the connection circuit boards FPCB1 and FPCB2 is adjacent to the output pads P1-0 and P2-0, respectively, and the other end of each of the connection circuit boards FPCB1 and FPCB2 is adjacent to the input pads P1-I or P2-I, respectively.

After the one end of the first connection circuit board FPCB1 is bonded to the first pad area PDA1, the other end of the first connection circuit board FPCB1 may droop due to gravitational force applied in a direction opposite to the third direction (e.g., the DR3 direction), as illustrated in FIG. 6. Likewise, after the one end of the second connection circuit board FPCB2 is bonded to the second pad area PDA2, the other end of the second connection circuit board FPCB2 may droop by gravity in the direction opposite to the third direction (e.g., the DR3 direction). A planar area of the first connection circuit board FPCB1 disposed on the display panel DP may be less than a planar area of the second connection circuit board FPCB2 disposed on the display panel DP. Thus, a gradient at which the other end of the first connection circuit board FPCB1 droops may be greater than a gradient at which the other end of the second connection circuit board FPCB2 droops.

For example, a degree of drooping of the other end of the first connection circuit board FPCB1 may be different from a degree of drooping of the other end of the second connection circuit board FPCB2, and thus a separation distance DS may occur between the first and second connection circuit boards FPCB1 and FPCB2. As the separation distance DS increases, a degree of misalignment may increase in the process of bonding the connection circuit boards FPCB1 and FPCB2 to the driving circuit board MPCB.

According to exemplary embodiments of the present invention, the separation distance DS may be controlled by the first and second protruding portions P1-F and P2-F of the first and second connection circuit boards FPCB1 and FPCB2. This will be described later in detail.

Figure 7A:
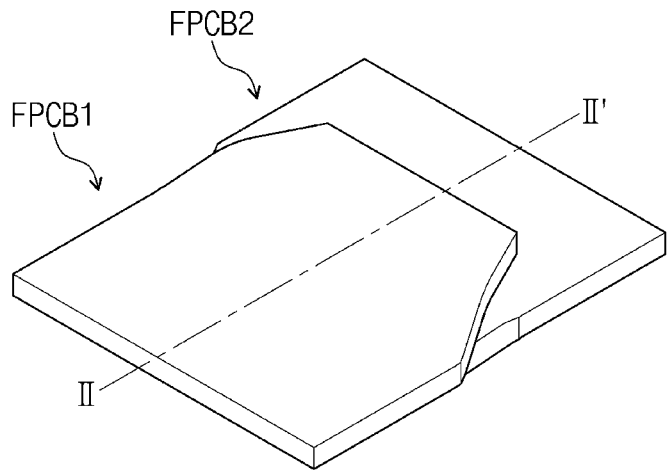
FIG. 7A is a perspective view illustrating an area 'AA' of FIG. 4 in which a first connection circuit board and a second connection circuit board are shown according to an exemplary embodiment of the present invention.
Figure 7B:
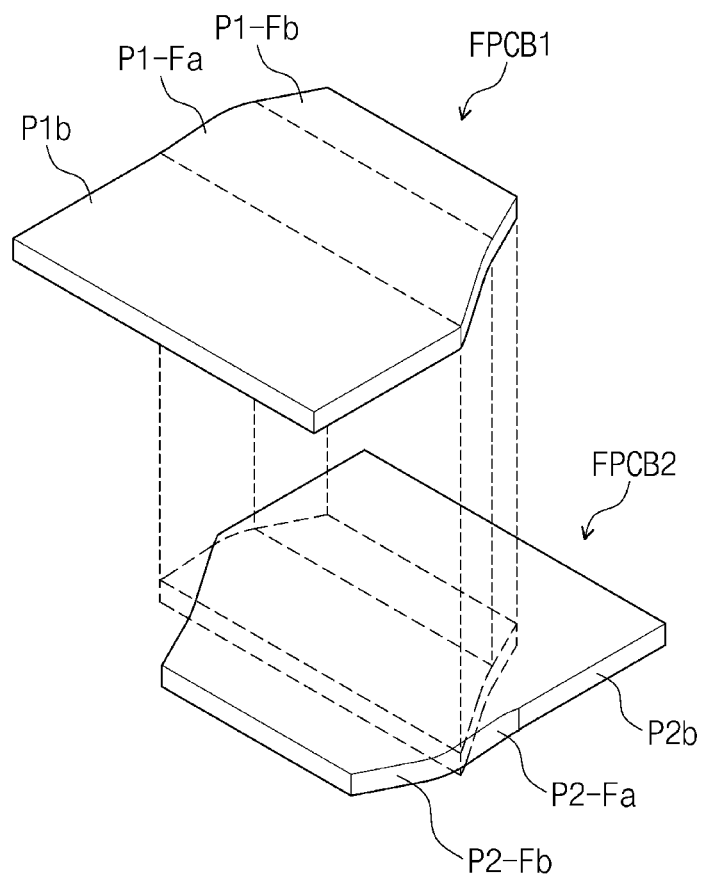
FIG. 7B is an exploded perspective view illustrating the first connection circuit board and the second connection circuit board of FIG. 7A.
Figure 7C:
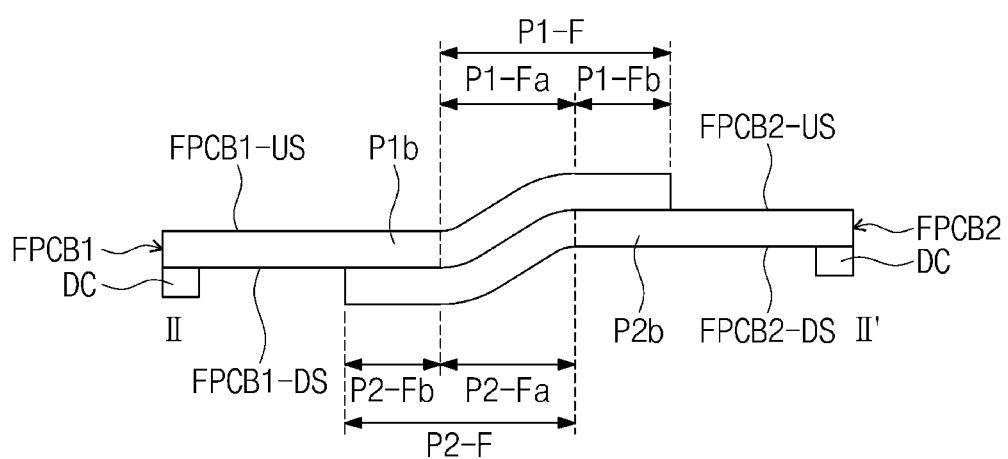
FIG. 7C is a cross-sectional view taken along a line II-II' of FIG. 7A.

FIG. 7A is a perspective view of an area 'AA' of FIG. 4 to illustrate a first connection circuit board FPCB1 and a second connection circuit board FPCB2 according to an exemplary embodiment of the present invention. FIG. 7B is an exploded perspective view illustrating the first connection circuit board FPCB and the second connection circuit board FPCB2 of FIG. 7A. FIG. 7C is a cross-sectional view taken along a line II-II' of FIG. 7A.

Referring to FIGS. 7A to 7C, the first input portion P1b and the first protruding portion P1-F of the first connection circuit board FPCB1 are illustrated, and the second input portion P2b and the second protruding portion P2-F of the second connection circuit board FPCB2 are illustrated. The first connection circuit board FPCB1 includes a top surface FPCB1-US and a bottom surface FPCB1-DS parallel to the top surface FPCB1-US, and the second connection circuit board FPCB2 includes a top surface FPCB2-US and a bottom surface FPCB2-DS parallel to the top surface FPCB2-US.

Referring to FIGS. 7B and 7C, the first protruding portion P1-F and the second protruding portion P2-F overlap each other in a thickness direction (e.g., the DR3 direction). For example, a first portion P1-Fa of the first protruding portion P1-F may overlap a third portion P2-Fa of the second protruding portion P2-F, and a second portion P1-Fb of the first protruding portion P1-F may overlap the second input portion P2b. In addition, a fourth portion P2-Fb of the second protruding portion P2-F may overlap the first input portion P1b. According to an exemplary embodiment of the present invention, at least a portion of the first protruding portion P1-F is disposed on the top surface FPCB2-US of the second input portion P2b. The first protruding portion P1-F includes the first portion P1-Fa having a curved shape, and the second portion P1-Fb extending from the first portion P1-Fa and disposed on the top surface FPCB2-US of the second input portion P2b. The first portion P1-Fa and the second portion P1-Fb of the first protruding portion P1-F may constitute a single unitary body. A portion of the first protruding portion P1-F may have the curved shape. Alternatively, the whole of the first protruding portion P1-F may have a curved shape.

At least a portion of the second protruding portion P2-F is disposed on the bottom surface FPCB1-DS of the first input portion P1b. The second protruding portion P2-F includes the third portion P2-Fa having a curved shape, and the fourth portion P2-Fb extending from the third portion P2-Fa and disposed on the bottom surface FPCB1-DS of the first input portion P1b. The third portion P2-Fa and the fourth portion P2-Fb of the second protruding portion P2-F may constitute a single unitary body. A portion of the second protruding portion P2-F may have the curved shape. Alternatively, the whole of the second protruding portion P2-F may have a curved shape. As illustrated in FIG. 4, the second output portion P2a of the second connection circuit board FPCB2 overlaps at least a portion of the first output portion P1a of the first connection circuit board FPCB1. As illustrated in FIG. 7C, the first protruding portion P1-F is disposed on the second protruding portion P2-F and the second input portion P2b.

According to an exemplary embodiment of the present invention, the second and fourth portion P1-Fb and P2-Fb might not overlap the driving chip DC. For example, when the driving chip DC of the first connection circuit board FPCB1 is disposed on the bottom surface FPCB1-DS, an end of the fourth portion P2-Fb may be spaced apart from the driving chip DC by a predetermined distance in the first direction (e.g., the DR1 direction).

According to the above descriptions, the first connection circuit board FPCB1 and the second connection circuit board FPCB2 are fixed to each other by the first protruding portion P1-F and the second output portion P2a, and thus the separation distance DS of FIG. 6 may not be increased. As a result, the connection circuit boards FPCB1 and FPCB2 may be easily aligned with the driving circuit board MPCB before the process of bonding the connection circuit boards FPCB1 and FPCB2 to the driving circuit board MPCB.

Figure 8A:
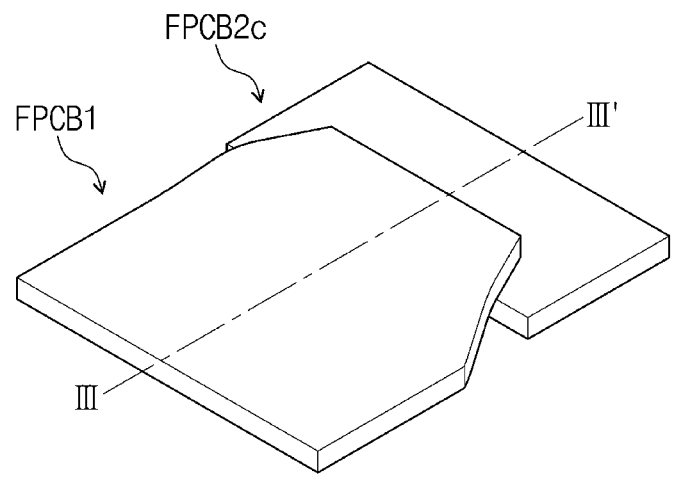
FIG. 8A is a perspective view illustrating the area 'AA' of FIG. 4 in which a first connection circuit board and a second connection circuit board are shown according to an exemplary embodiment of the present invention.
Figure 8B:
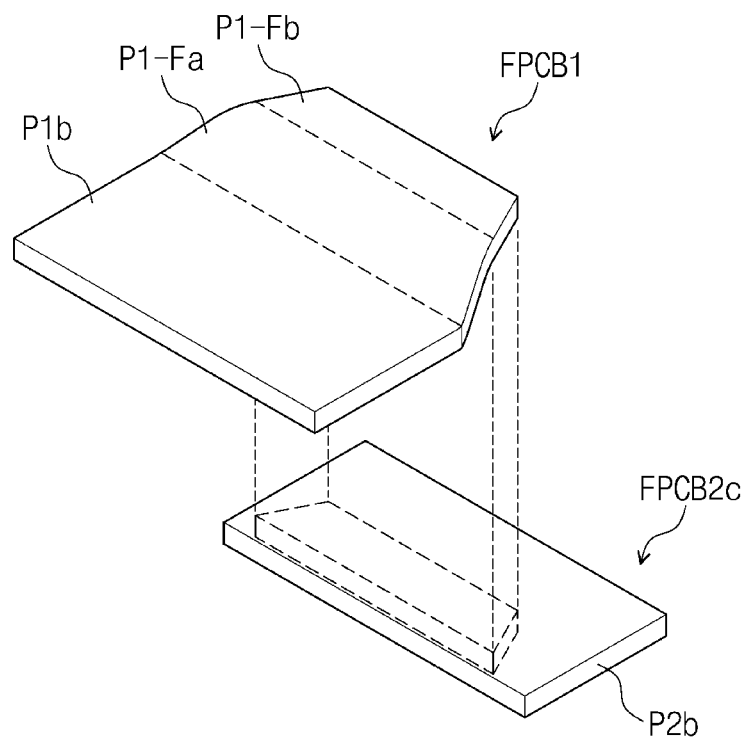
FIG. 8B is an exploded perspective view illustrating the first connection circuit board and the second connection circuit board of FIG. 8A.
Figure 8C:
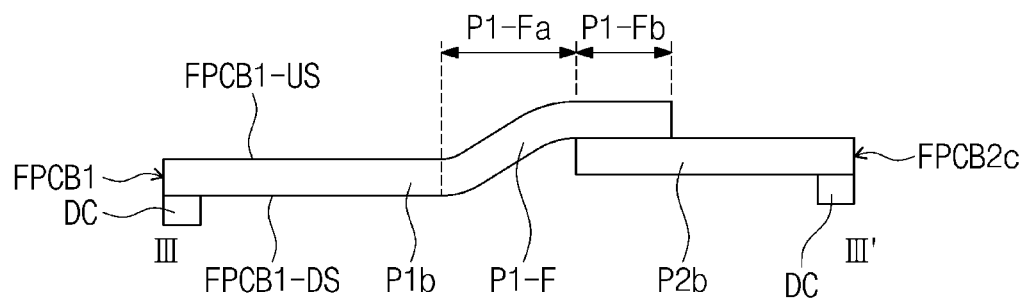
FIGS. 8C and 8D are cross-sectional views taken along a line III-III' of FIG. 8A according to exemplary embodiments of the present invention.
Figure 8D:
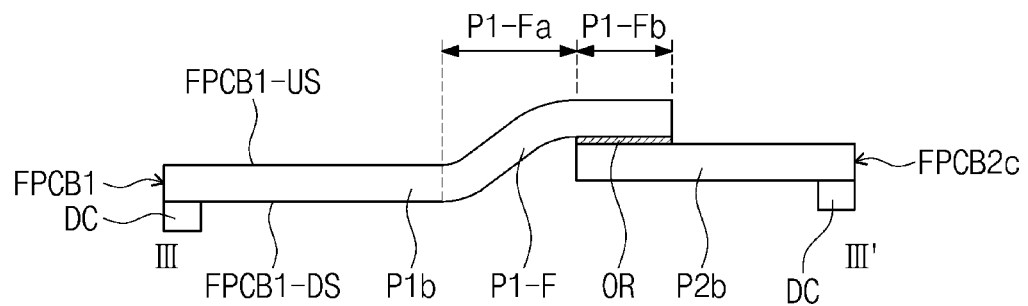

FIG. 8A is a perspective view of the area 'AA' of FIG. 4 to illustrate a first connection circuit board and a second connection circuit board according to an exemplary embodiment of the present invention. FIG. 8B is an exploded perspective view illustrating the first connection circuit board and the second connection circuit board of FIG. 8A. FIGS. 8C and 8D are cross-sectional views taken along a line III-III' of FIG. 8A.

A first connection circuit board FPCB1 of FIGS. 8A and 8B may be substantially the same as the first connection circuit board FPCB1 of FIG. 7A. Hereinafter, a modified structure of a second connection circuit board FPCB2c will be mainly described with reference to FIGS. 8A to 8D.

According to an exemplary embodiment of the present invention, the second connection circuit board FPCB2c may include the second output portion P2a and the second input portion P2b. For example, the second connection circuit board FPCB2c does not include the second protruding portion P2-F of the second connection circuit board FPCB2 illustrated in FIG. 7C.

As illustrated in FIGS. 8B and 8C, the first protruding portion P1-F of the first connection circuit board FPCB1 includes the first portion P1-Fa and the second portion P1-Fb. The first portion P1-Fa has a curved shape and does not overlap the second connection circuit board FPCB2c, and the second portion P1-Fb is disposed on the second input portion P2b. For example, as described above, the second output portion P2a overlaps at least a portion of the first output portion P1a, and the first protruding portion P1-F is disposed on the second input portion P2b.

Accordingly, the first connection circuit board FPCB1 and the second connection circuit board FPCB2c are fixed to each other by the first protruding portion P1-F and the second output portion P2a, and thus the separation distance DS of FIG. 6 may not be increased. As a result, the connection circuit boards FPCB1 and FPCB2c may be easily aligned with the driving circuit board MPCB before the process of bonding the connection circuit boards FPCB1 and FPCB2 to the driving circuit board MPCB.

Referring to FIG. 8D, an adhesive OR is disposed between the second portion P1-Fb of the first protruding portion P1-F and the second input portion P2b. The first connection circuit board FPCB1 and the second connection circuit board FPCB2c may be more firmly fixed to each other by the adhesive OR.

Figure 9:
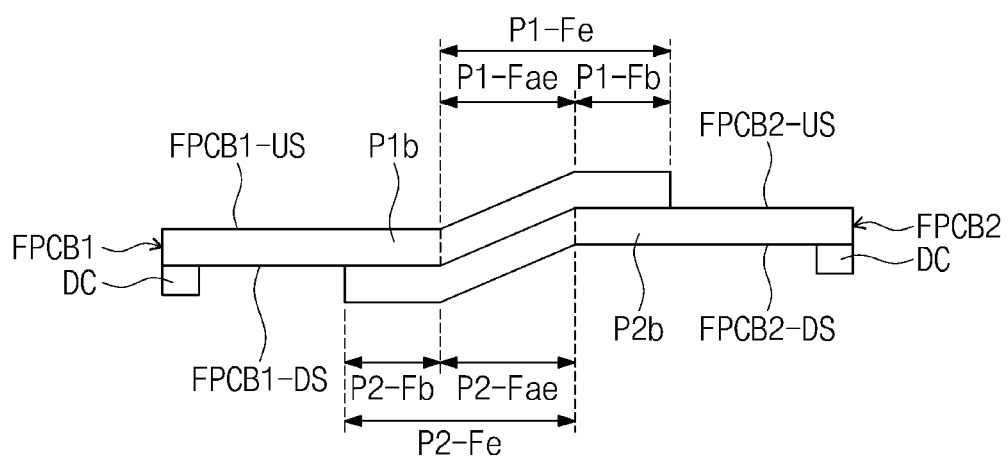
FIG. 9 is a cross-sectional view illustrating a first connection circuit board and a second connection circuit board according to an exemplary embodiment of the present invention.

FIG. 9 is a cross-sectional view illustrating a first connection circuit board and a second connection circuit board according to an embodiment of the invention.

Shapes of protruding portions of first and second connection circuit boards FPCB1 and FPCB2 of FIG. 9 are different from those of the protruding portions of the first and second connection circuit boards FPCB1 and FPCB2 of FIG. 7C, and other components of the first and second connection circuit boards FPCB1 and FPCB2 of FIG. 9 may be substantially the same as corresponding components of the first and second connection circuit boards FPCB1 and FPCB2 of FIG. 7C.

Referring to FIG. 9, a first protruding portion P1-Fe of the first connection circuit board FPCB1 has a bent shape, and a second protruding portion P2-Fe of the second connection circuit board FPCB2 also has a bent shape. For example, the bent shapes of the first and second protruding portions P1-Fe and P2-Fe may each be comprised of interconnected first and second linear portions angled with respect to each other. For example, the first linear portion may extend from a side surface of the first or second connection circuit board FPCB1 or FPCB2 and may be sloped with respect to the first direction (e.g., the DR1 direction), in a cross sectional view. The second linear portion may extend from a side surface of the first linear portion in parallel to an axis of the first direction (e.g., the DR1 direction). The overall shapes of the first and second protruding portions P1-Fe and P2-Fe may be complimentary to one another in a cross sectional view and overlap in a thickness direction. The first protruding portion P1-Fe includes a first linear portion P1-Fae extending from a side surface of the first connection circuit board FPCB1 and has an inclined linear shape, and a second linear portion P1-Fb extending from a side surface of the the first linear portion P1-Fae and disposed on the top surface FPCB2-US of the second input portion P2b. The second protruding portion P2-Fe includes a first linear portion which may also be referred to herein as a third portion P2-Fae extending from a side surface of the second connection circuit board FPCB2 and having a declined linear shape, and a second linear portion which may also be referred to herein as a fourth portion P2-Fb extending from a side surface of the third portion P2-Fae and disposed on the bottom surface FPCB1-DS of the first input portion P1b.

As described above, the first and second protruding portions P1-Fe and P2-Fe of the first and second connection circuit boards FPCB1 and FPCB2 may have the bent shapes. However, exemplary embodiments of the present invention are not limited thereto. According to an exemplary embodiment of the present invention, each of the first and second protruding portions P1-Fe and P2-Fe may include a portion having a curved shape and another portion having a linear shape. According to an exemplary embodiment of the present invention, the first and second protruding portions P1-Fe and P2-Fe may include an interlocking means in which one possesses an insertion portion on a first surface and the other possesses a receiving groove at a second surface adjacent to the first surface to receive the insertion portion.

Figure 10A:
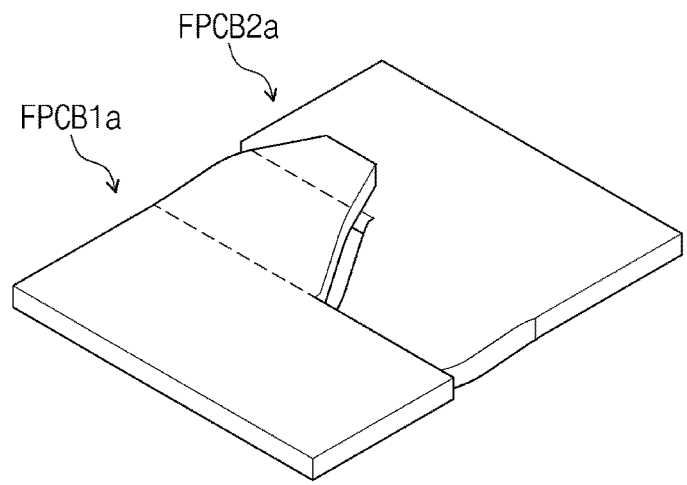
FIG. 10A is a perspective view illustrating the area 'AA' of FIG. 4 in which a first connection circuit board and a second connection circuit board are shown according to an exemplary embodiment of the present invention.
Figure 10B:
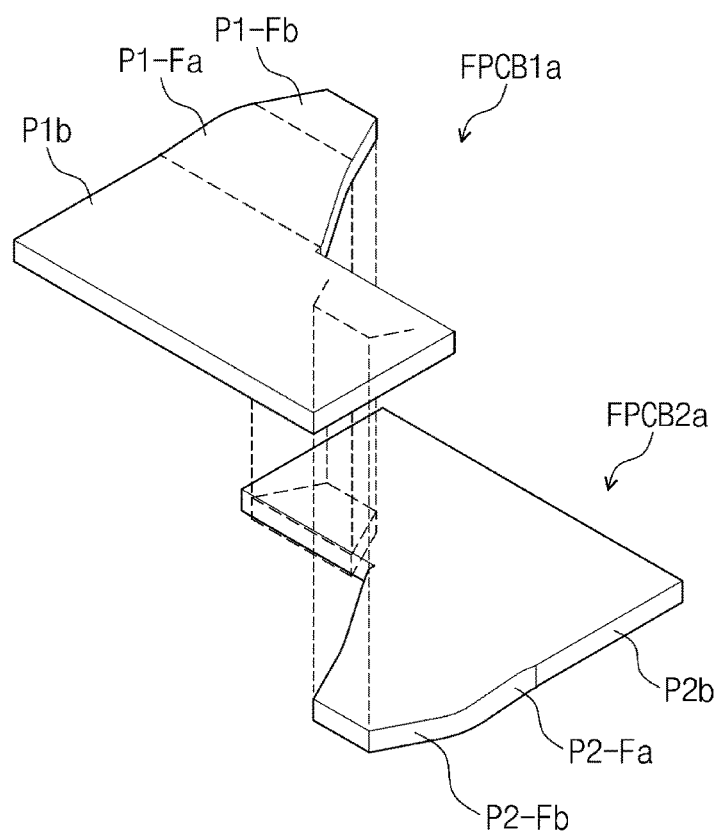
FIG. 10B is an exploded perspective view illustrating the first connection circuit board and the second connection circuit board of FIG. 10A.
Figure 10C:
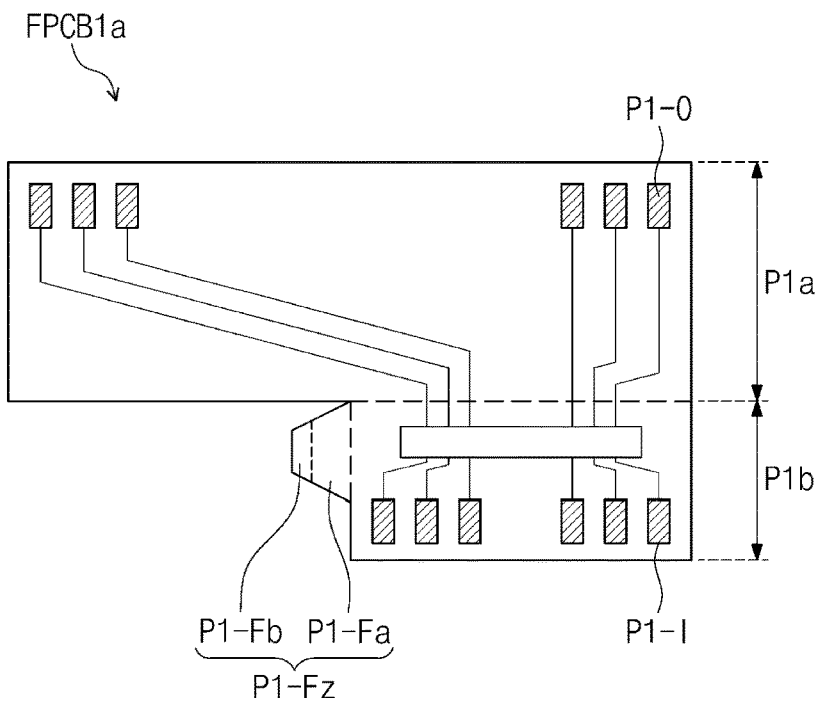
FIG. 10C is a plan view illustrating a bottom surface of a first connection circuit board according to an exemplary embodiment of the present invention.
Figure 10D:
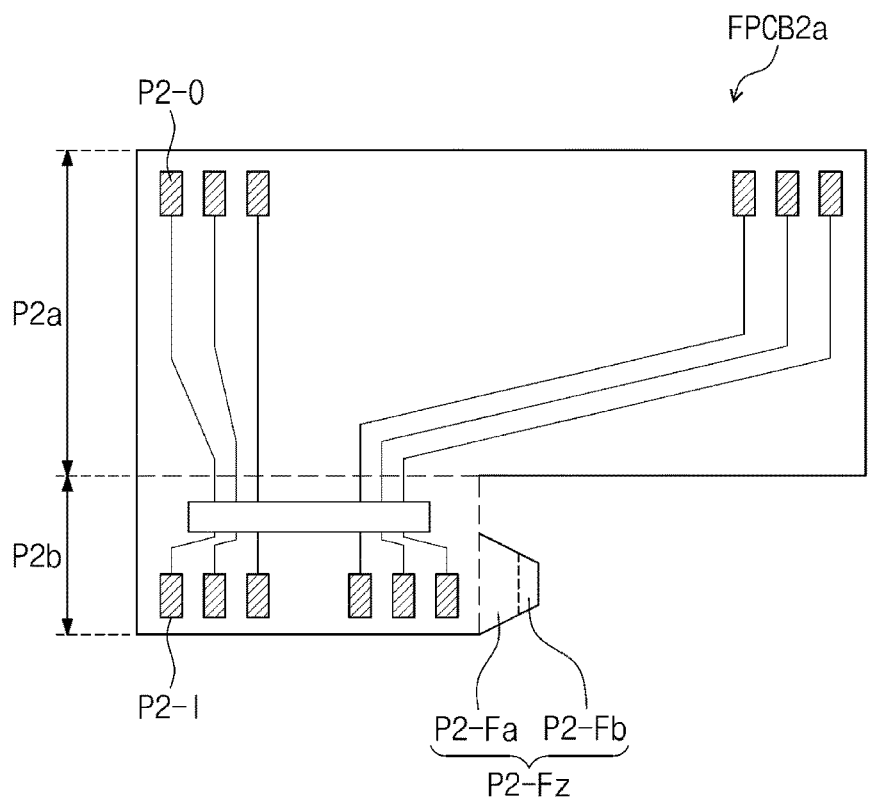
FIG. 10D is a plan view illustrating a bottom surface of a second connection circuit board according to an exemplary embodiment of the present invention.

FIG. 10A is a perspective view of the area 'AA' of FIG. 4 to illustrate a first connection circuit board and a second connection circuit board according to an exemplary embodiment of the present invention. FIG. 10B is an exploded perspective view illustrating the first connection circuit board and the second connection circuit board of FIG. 10A. FIG. 10C is a plan view illustrating a bottom surface of a first connection circuit board according to an exemplary embodiment of the present invention. FIG. 10D is a plan view illustrating a bottom surface of a second connection circuit board according to an exemplary embodiment of the present invention.

Except for a structure of a first protruding portion, other components and structures of a first connection circuit board FPCB1a of FIG. 10A may be substantially the same as corresponding components and structures of the first connection circuit board FPCB1 of FIG. 7A. Except for a structure of a second protruding portion, other components and structures of a second connection circuit board FPCB2a of FIG. 10A may be substantially the same as corresponding components and structures of the second connection circuit board FPCB2 of FIG. 7A.

Referring to FIGS. 10C and 10D, bottom surfaces of the first and second connection circuit boards FPCB1a and FPCB2a are shown. The bottom surface of each of the first and second connection circuit boards FPCB1a and FPCB2a may be defined as a surface on which pads and the driving chip are exposed.

As illustrated in FIG. 10B, a first protruding portion P1-Fz of the first connection circuit board FPCB1a may not overlap a second protruding portion P2-Fz of the second connection circuit board FPCB2a. For example, in a plan view, the first protruding portion P1-Fz and the second protruding portion P2-Fz may be spaced apart in a second direction (e.g., the DR2 direction) and may extend in opposite directions to one another in parallel to an axis defined by the first direction (e.g., the DR1 direction).

In detail, as illustrated in FIG. 10C, the first protruding portion P1-Fz may include a first portion P1-Fa not overlapping the second connection circuit board FPCB2a and having a curved shape, and a second portion P1-Fb disposed on the top surface FPCB2-US (see FIG. 7C) of the second input portion P2b. As illustrated in FIG. 10D, the second protruding portion P2-Fz may include a third portion P2-Fa not overlapping the first connection circuit board FPCB1a and having a curved shape, and a fourth portion P2-Fb disposed on the bottom surface FPCB1-DS (see FIG. 7C) of the first input portion P1b.

According to an exemplary embodiment of the present invention, an adhesive may be disposed between the second portion P1-Fb and the second input portion P2b. This may be substantially the same structure as the adhesive OR disposed between the second portion P1-Fb and the second input portion P2b in FIG. 8D. In addition, an adhesive may be disposed between the fourth portion P2-Fb and the first input portion P1b, or this adhesive may be omitted.

Figure 11A:
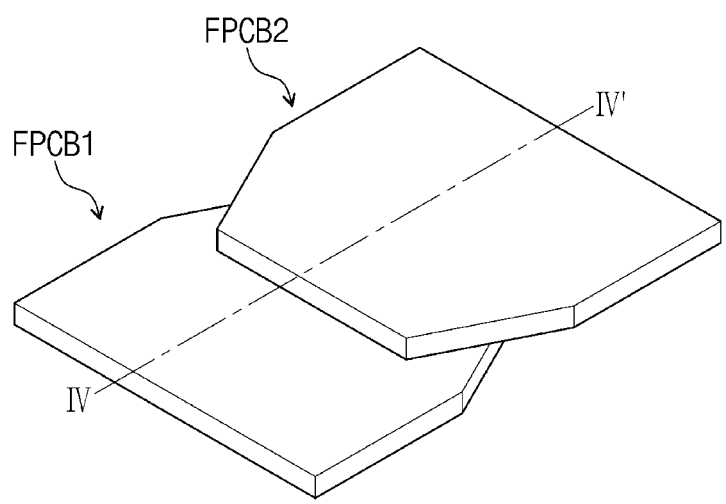
FIG. 11A is a perspective view illustrating a first connection circuit board and a second connection circuit board according to an exemplary embodiment of the present invention.
Figure 11B:
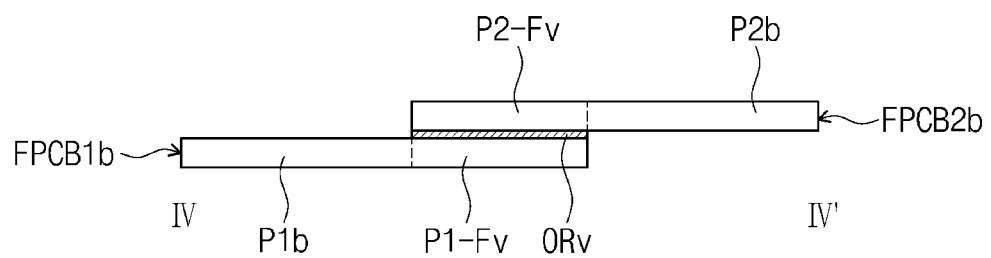
FIG. 11B is a cross-sectional view taken along a line IV-IV' of FIG. 11A.

FIG. 11A is a perspective view illustrating a first connection circuit board FPCB1 and a second connection circuit board FPCB2 according to an exemplary embodiment of the present invention. FIG. 11B is a cross-sectional view taken along a line IV-IV' of FIG. 11A.

Except for a structure of a first protruding portion, other components and structures of a first connection circuit board FPCB1b of FIG. 11A may be substantially the same as corresponding components and structures of the first connection circuit board FPCB1 of FIG. 7A. Except for a structure of a second protruding portion, other components and structures of a second connection circuit board FPCB2b of FIG. 11A may be substantially the same as corresponding components and structures of the second connection circuit board FPCB2 of FIG. 7A.

Referring to FIG. 11B, a first protruding portion P1-Fv of the first connection circuit board FPCB1b overlaps a second protruding portion P2-Fv of the second connection circuit board FPCB2b. The second protruding portion P2-Fv is disposed on the first protruding portion P1-Fv. For example, the second output portion P2a of the second connection circuit board FPCB2b is disposed on the first output portion P1a of the first connection circuit board FPCB1b, and the second protruding portion P2-Fv is disposed on a top surface of the first protruding portion P1-Fv.

According to exemplary embodiment of the present invention, an adhesive ORv is disposed between the first protruding portion P1-Fv and the second protruding portion P2-Fv. For example, the top surface of the first protruding portion P1-Fv and a bottom surface of the second protruding portion P2-Fv are adhered to each other through the adhesive ORv.

In addition, the first protruding portion P1-Fv does not overlap the second input portion P2b of the second connection circuit board FPCB2b, and the second protruding portion P2-Fv does not overlap the first input portion P1b of the first connection circuit board FPCB1b.

According to the exemplary embodiments of the present invention, the process of bonding the connection circuit boards to the driving circuit board may be performed more easily and efficiently.

While the present invention has been described with reference to exemplary embodiments, it will be apparent to those skilled in the art that various changes and modifications may be made without departing from the spirits and scopes of the invention. Therefore, it should be understood that the above exemplary embodiments are not limiting, but merely illustrative. Thus, the scopes of the invention are to be determined by the broadest permissible interpretation of the following claims and their equivalents, and shall not be restricted or limited by the foregoing description.

What is claimed is:

1. A display device, comprising:
    a display panel comprising: a plurality of first pads arranged in a first row; and a plurality of second pads arranged in a second row;
    a driving circuit board configured to provide driving signals to the display panel;
    a first connection circuit board comprising: a first output portion on which first output pads bonded to the first pads of the display panel are disposed; a first input portion on which first input pads bonded to the driving circuit board are disposed; and a first protruding portion; and
    a second connection circuit board comprising: a second output portion which overlaps at least a portion of the first output portion and on which second output pads bonded to the second pads of the display panel are disposed; a second input portion on which second input pads bonded to the driving circuit hoard are disposed; and a second protruding portion protruding from the second input portion,
    wherein at least a portion of the first protruding portion is disposed on the second input portion,
    wherein a top surface of the first protruding portion is angled with respect to a plane of top surface of the first input portion such that the first connection circuit board is bent at an interface between the first input portion and the first protruding portion, and
    wherein a top surface of the second protruding portion is angled with respect to a plane of a top surface of the second input portion such that the second connection circuit board is bent at an interface between the second input portion and the second protruding portion.

2. The display device of claim 1, wherein the display panel includes: a display area; and a non-display area which is adjacent to the display area and in which the first pads and the second pads are disposed, and
    wherein the second output portion is closer to the display area than the first output portion.

3. The display device of claim 1, wherein the first protruding portion includes:
    a first portion not overlapping the second connection circuit board; and a second portion overlapping the second input portion.

4. The display device of claim 3, wherein the first portion of the first protruding portion has a curved shape.

5. The display device of claim 3, further comprising:
    an adhesive disposed between the second portion and a top surface of the second connection circuit board.

6. The display device of claim 3, wherein an area of the first portion is greater than an area of the second portion.

7. The display device of claim 1, wherein the second output pads and the second input pads are disposed on a bottom surface of the second connection circuit board.

8. The display device of claim 1, wherein at least a portion of the second protruding portion is disposed on a bottom surface of the first input portion.

9. The display device of claim 8, wherein the first protruding portion is disposed on a top surface of the second input portion.

10. The display device of claim 8, wherein the first protruding portion and the second protruding portion overlap each other.

11. The display device of claim 8, wherein each of the first and second protruding portions includes a curved portion.

12. The display device of claim 8, wherein the first protruding portion and the second protruding portion do not overlap each other.

13. The display device of claim 12, wherein the first protruding portion includes: a first portion not overlapping the second connection circuit board; and a second portion disposed on the top surface of the second input portion, and
    wherein the second protruding portion includes: a third portion not overlapping the first connection circuit board; and a fourth portion disposed on the bottom surface of the first input portion.

14. The display device: of claim 13, further comprising:
    an adhesive disposed between the second portion and the second input portion.

15. The display device of claim 1, wherein an area of the first output portion is greater than an area of the first input portion when viewed in a plan view, and an area of the second output portion is greater than an area of the second input portion when viewed in a plan view.

16. The display device of claim 15, wherein the area of the second output portion is greater than the area of the first output portion.

17. A display device, comprising:
    a display panel comprising: a plurality of first pads arranged in a first row; and a plurality of second pads arranged in a second row;
    a driving circuit board configured to provide driving signals to the display panel;
    a first connection circuit board comprising: a first output portion on which first output pads bonded to the first pads are disposed; a first input portion on which first input pads bonded to the driving circuit board are disposed; and a substantially flat first protruding portion protruding from the first input portion;

a second connection circuit board comprising: a second output portion which overlaps at least a portion of the first output portion and on which second output pads bonded to the second pads are disposed; a second input portion on which second input pads bonded to the driving circuit board are disposed; and a substantially flat second protruding portion connected to the second input portion and disposed on the first protruding portion; and an adhesive disposed between the first protruding portion and the second protruding portion, wherein a top surface of the first protruding portion is angled with respect to a plane of a top surface of the first input portion such that the first connection circuit board is bent at an interface between the first input portion and the first protruding portion, and wherein a top surface of the second protruding portion is angled with respect to a plane of a top surface of the second input portion such that the second connection circuit board is bent at an interface between the second input portion and the second protruding portion.

18. The display device of claim 17, wherein the second pads are disposed nearer to a display area of the display panel than the first pads, when viewed in a plan view, and wherein the first connection circuit board and the second connection circuit board are flexible printed circuit boards.

19. The display device of claim 17, wherein the first protruding portion does not overlap the second input portion, and the second protruding portion does not overlap the first input portion.

20. A display device, comprising:

a display panel;

a driving circuit board;

a first connection circuit board including an upper and a lower surface disposed between the display panel and the driving printed circuit board, wherein the lower surface of the first connection board is electrically connected to both the display panel and the driving circuit board; and a second connection circuit board disposed on the upper surface of the first connection circuit board, wherein a portion of the last connection circuit board is disposed on an upper surface of the second connection circuit board, wherein the first connection circuit board includes a first protruding portion, wherein an upper surface of the first protruding portion is angled with respect to a plane of the upper surface of the first connection circuit board, wherein the second connection circuit board includes a second protruding portion, wherein an upper surface of the second protruding portion is angled with respect to a plane of the upper surface of the second connection circuit board, and wherein the first protruding portion at least partially overlaps the second protruding portion.

* * * * *